United States Patent
Shibata et al.

(10) Patent No.: US 7,901,800 B2
(45) Date of Patent: Mar. 8, 2011

(54) PIEZOELECTRIC ELEMENT

(75) Inventors: Kenji Shibata, Tsukuba (JP); Fumihito Oka, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/073,238

(22) Filed: Mar. 3, 2008

(65) Prior Publication Data

US 2009/0075066 A1 Mar. 19, 2009

(30) Foreign Application Priority Data

Sep. 18, 2007 (JP) ................. 2007-241207

(51) Int. Cl.
 *B32B 9/00* (2006.01)
 *B32B 19/00* (2006.01)
 *G11B 11/105* (2006.01)
 *G11B 5/64* (2006.01)
 *H01L 41/00* (2006.01)
 *H02N 2/00* (2006.01)

(52) U.S. Cl. ......... 428/701; 310/311; 310/357; 310/358; 428/332; 428/336; 428/702

(58) Field of Classification Search ................. 310/311, 310/357, 358; 428/332, 336, 701, 702
See application file for complete search history.

(56) References Cited

U.S. PATENT DOCUMENTS

| | | | | |
|---|---|---|---|---|
| 2,976,246 | A * | 3/1961 | Egerton et al. | 252/62.9 R |
| 6,518,609 | B1 * | 2/2003 | Ramesh | 257/295 |
| 2003/0001454 | A1 * | 1/2003 | Takeuchi et al. | 310/311 |
| 2004/0207695 | A1 * | 10/2004 | Aoto et al. | 347/68 |
| 2005/0185026 | A1 * | 8/2005 | Noguchi et al. | 347/68 |
| 2007/0024162 | A1 * | 2/2007 | Shibata et al. | 310/358 |
| 2007/0126313 | A1 * | 6/2007 | Ueno et al. | 310/311 |

FOREIGN PATENT DOCUMENTS

JP 2007-19302 1/2007

OTHER PUBLICATIONS

Blomqvist et al., "Visible and IR Light Waveguiding in Ferroelectric Na0.5K0.5NbO3 Thin Films". Integrated Ferroelectrics, vol. 69, (2005) pp. 277-286.*
Blomqvist et al. "RF sputtered Na0.5K0.5NbO3 Films on Oxide Substrates as Optical Waveguiding Material", Integrated Ferroelectrics, vol. 54, (2003) pp. 630-641.*
English Machine Translation of Japanese Publication (2007-019302) provided by the JPO website, Retrieval date of Feb. 26, 2009.*
Soderlind et al. "Sol-Gel synthesis and Characterization of Na0.5K0.5NbO3 thin films", Journal of Crystal Growth, vol. 281, 2005, pp. 468-474.*

* cited by examiner

*Primary Examiner* — Jennifer C McNeil
*Assistant Examiner* — Jonathan C Langman
(74) *Attorney, Agent, or Firm* — McGinn IP Law Group, PLLC

(57) ABSTRACT

A piezoelectric film formed above a Si substrate. The piezoelectric film is formed of a potassium sodium niobate expressed by a general formula $(K,Na)NbO_3$ with perovskite structure. A film thickness of the piezoelectric film is within a range from 0.3 μm to 10 μm. An intermediate film is formed between the Si substrate and the piezoelectric film. The intermediate film generates a stress in a compressive direction in the piezoelectric film.

13 Claims, 5 Drawing Sheets

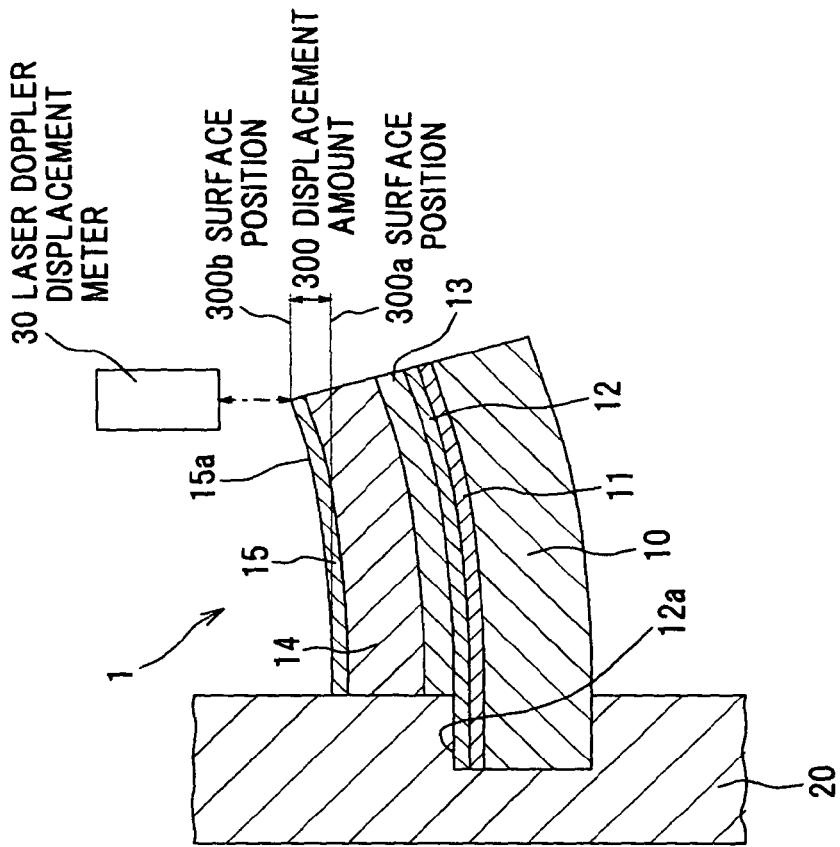
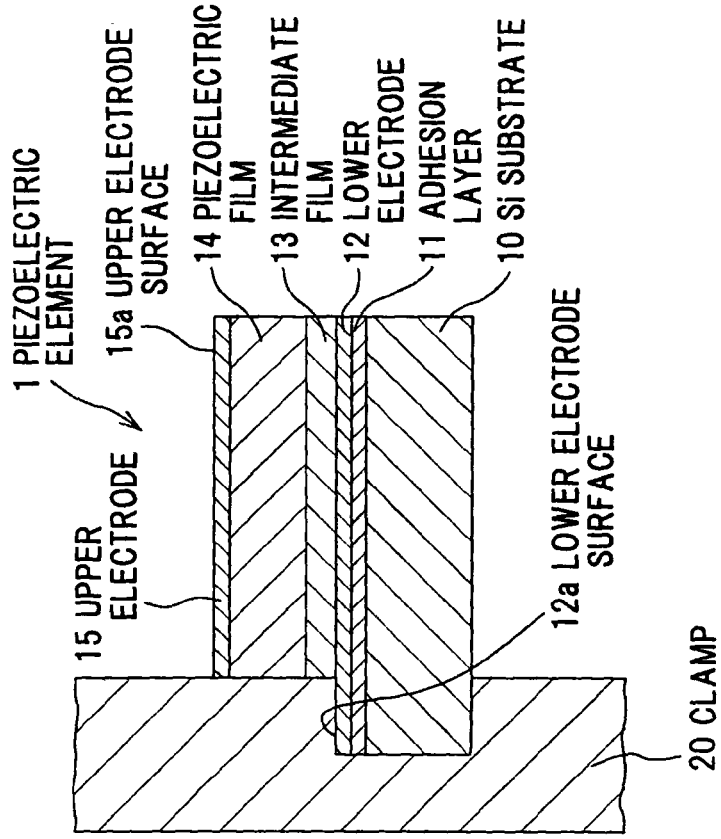

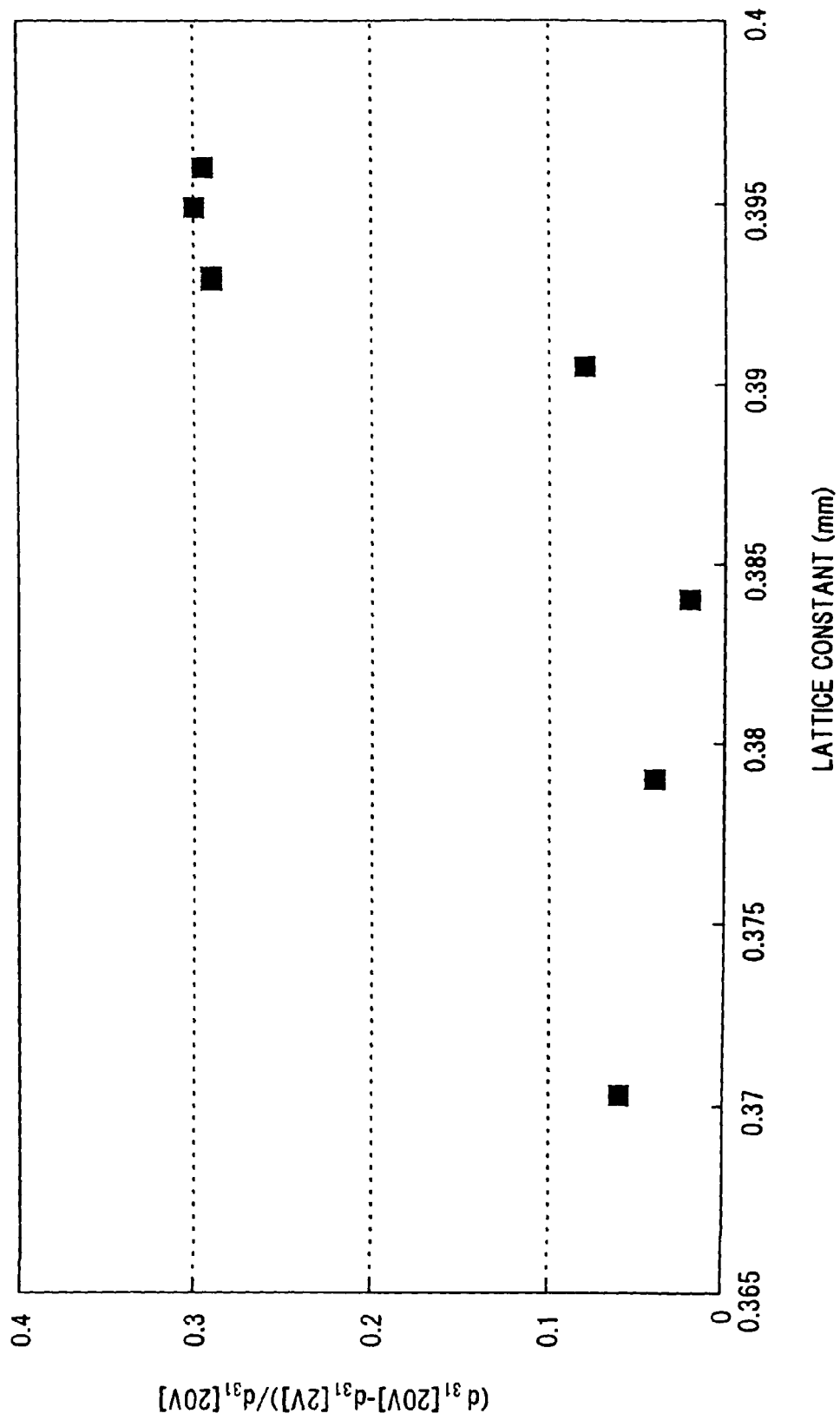

PIEZOELECTRIC ELEMENT

BACKGROUND OF THE INVENTION

The present application is based on Japanese Patent Application No. 2007-241207, the entire contents of which are incorporated herein by reference.

FIELD OF THE INVENTION

The present invention relates to a piezoelectric element, particularly to a piezoelectric element having a piezoelectric thin film formed on a silicon (Si) substrate.

RELATED ART

A piezoelectric element having a piezoelectric material is used for an actuator or a sensor etc for a head of a high-precision and high-speed inkjet printer. A $Pb(Zr_{1-x}Ti_x)O_3$ based perovskite-type ferroelectric substance (piezoelectric lead zirconium titanate: PZT) has been widely used as a piezoelectric material for forming such a piezoelectric element. However, since the PZT contains lead (Pb), it is desired to use a piezoelectric material containing no lead, i.e. a Pb-free piezoelectric material for a piezoelectric element from a consideration of environmental point of view. Further, it is desired that a piezoelectric constant $d_{31}$ is kept substantially constant through low voltage application and high voltage application, namely, a dependency of the piezoelectric constant $d_{31}$ to an applied voltage (applied voltage dependency of the piezoelectric constant) is small.

As a conventional Pb-free piezoelectric element, for instance, there is a piezoelectric element using a dielectric film comprising an alkali niobium oxide based perovskite compound. This piezoelectric element comprises a substrate comprising MgO etc., a lower electrode formed on the substrate, a buffer layer comprising $BaTiO_3$ etc. and formed on the lower electrode, a piezoelectric thin film comprising an alkali niobium oxide based perovskite compound expressed by a general formula of $(Na_xK_yLi_z)NbO_3$ ($0<x<1, 0<y<1$, and $x+y+z=1$) and formed on the buffer layer, and an upper electrode formed on the piezoelectric thin film. For instance, Japanese Patent Laid-Open No. 2007-19302 (JP-A-2007-19302) discloses this type of Pb-free piezoelectric element.

However, in the piezoelectric element according to JP-A-2007-19302, when a potassium sodium niobate thin film is formed on the Si substrate, there is a disadvantage that the applied voltage dependency of the piezoelectric constant $d_{31}$ of the piezoelectric element will be increased greatly, compared with the case that the potassium sodium niobate thin film is formed on a substrate of MgO or $SrTiO_3$.

THE SUMMARY OF THE INVENTION

Therefore, it is an object of the invention to provide a piezoelectric element using a Si substrate, by which it is possible to suppress the applied voltage dependency of the piezoelectric constant $d_{31}$.

According to a feature of the invention, a piezoelectric element comprises:
a Si substrate;
a piezoelectric film formed above the Si substrate and comprising a potassium sodium niobate expressed by a general formula $(K,Na)NbO_3$ with perovskite structure with a film thickness within a range of 0.3 μm to 10 μm; and
an intermediate layer formed between the Si substrate and the piezoelectric film for generating a stress in a compressive direction in the piezoelectric film.

Further, in the piezoelectric element, the intermediate layer may comprise a material with perovskite structure having a lattice constant smaller than a lattice constant of the potassium sodium niobate composing the piezoelectric film. The material composing the intermediate layer may comprise a compound having a pseudo-cubic or cubic crystal with perovskite structure and a lattice constant of 0.391 nm or less.

Still further, in the piezoelectric element, the intermediate layer may comprise $LaNiO_3$, $SrTiO_3$, $LaAlO_3$, or $YAlO_3$, or a mixed crystal of $LaNiO_3$, $SrTiO_3$, $LaAlO_3$, or $YAlO_3$. The intermediate layer further comprises additives of 10% or less of other elements and has the perovskite structure. The intermediate film may be preferentially oriented in one of plane orientations (100), (110), (010), and (111).

In the piezoelectric element, the piezoelectric film may be preferentially oriented in one of plane orientations (100), (110), (010), and (111). The piezoelectric element may further comprise a thermally-oxidized film on the Si substrate. The piezoelectric element may further comprise a metallic layer comprising Pt or Pt and Ti between the intermediate film and the Si substrate. The Pt in the metallic layer may be preferentially oriented in a plane orientation (111). The piezoelectric film may further comprise additives 10 at. % or less in total of at least one of Li and Ta.

EFFECT OF THE INVENTION

According to the present invention, it is possible to suppress the applied voltage dependency of the piezoelectric constant $d_{31}$, even when the Si substrate is used in the piezoelectric element.

BRIEF DESCRIPTION OF THE DRAWINGS

Next, the present invention will be explained in more detail in conjunction with appended drawings, wherein:

FIGS. 4A and 4B are schematic diagrams showing an evaluation method of the piezoelectric characteristic of the piezoelectric element in the preferred embodiment; and FIG. 5 is a graph showing a relationship of value of $((d_{31}[20V]-d_{31}[2V])/d_{31}[20V])$ with respect to a lattice constant of a material with a perovskite structure composing an intermediate film.

DESCRIPTION OF THE PREFERRED EMBODIMENT

Preferred Embodiment

Figure 1:
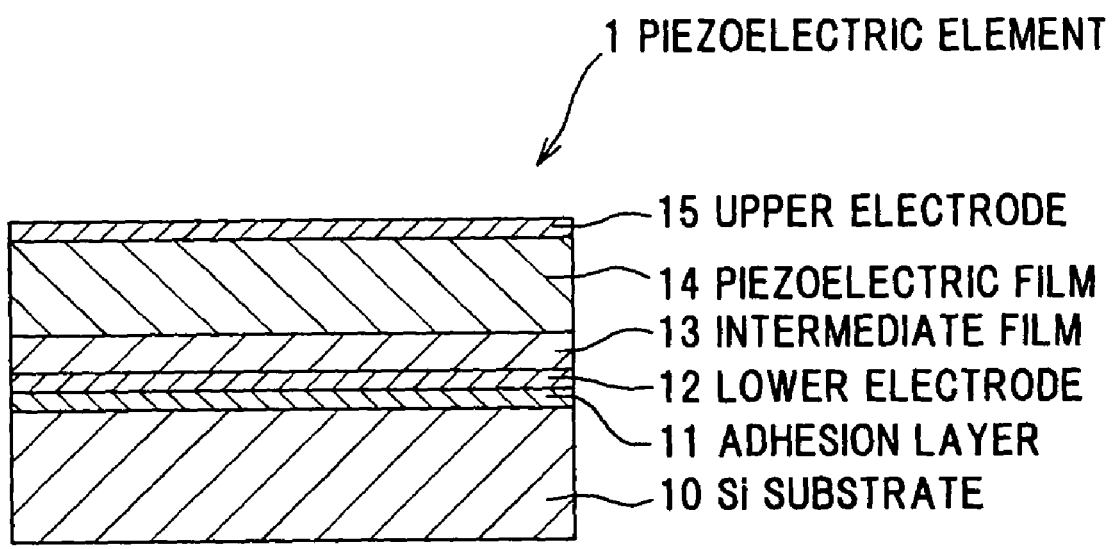
FIG. 1 is a cross sectional view of a piezoelectric element in a preferred embodiment according to the invention.

FIG. 1 is a cross sectional view of a piezoelectric element in a preferred embodiment according to the invention.

In the first preferred embodiment, a piezoelectric element 1 comprises a silicon (Si) substrate 10 having a plane orientation (100) as a substrate, an adhesion layer 11 as a part of a metallic layer formed on the Si substrate 10, a lower electrode 12 as a part of a metallic layer formed on the adhesion layer 11, an intermediate film 13 formed on the lower electrode 12, a piezoelectric film 14 formed as a piezoelectric thin film on the intermediate film 13, and an upper electrode 15 formed on the piezoelectric film 14 as shown in FIG. 1.

For instance, the Si substrate 10 is formed to have a substantially square shape of 20 mm×20 mm in plan view, and a thermally-oxidized film is formed on a surface of the Si substrate 10. The Si substrate 10 comprises a substrate with a thickness of 0.5 mm is used. Further, the adhesion layer 11 is provided between the Si substrate 10 and the lower electrode 12, and the adhesion layer 11 comprises a metallic material such as titanium (Ti). The adhesion layer 11 comprises Ti having a thickness of 2 nm, for instance. The lower electrode 12 comprises a conductive material containing a metallic material such as platinum (Pt). The lower electrode 12 comprises Pt having a film thickness of 0.2 μm (preferred orientation (111)), namely, Pt which is preferentially oriented in the plane orientation (111).

An intermediate film 13 comprises a compound in perovskite structure, which has a lattice constant smaller than that of a material composing the piezoelectric film 14. Concretely, the intermediate film 13 comprises a compound having a pseudo-cubic or cubic crystal with perovskite structure and the lattice constant of 0.391 nm or less. For instance, the intermediate film 13 may comprise a compound selected from a group consisting of $LaNiO_3$, $SrTiO_3$, $LaAlO_3$, and $YAlO_3$, a mixed crystal of these compounds, or a compound composed of these compounds and 10% or less of other elements, which has the pseudo-cubic or cubic crystal with perovskite structure and the lattice constant of 0.391 nm or less. For instance, the intermediate film 13 may comprise $LaNiO_3$ layer having a thickness of 0.2 μm. In addition, the intermediate film 13 is predominantly oriented in a plane orientation (100). The intermediate film 13 may be formed to be oriented in one of plane orientations (110), (010), and (111).

The piezoelectric film 14 comprises a Pb-free piezoelectric material having a perovskite structure. The piezoelectric film 14 is formed to have a film thickness within a range of 0.3 μm to 10 μm. The piezoelectric film 14 is formed to be adjacent to the intermediate film 13 at a predetermined region on the intermediate film 13. The piezoelectric film 14 comprises a potassium sodium niobate having a film thickness of 3 μm, for instance. The potassium sodium niobate is expressed by a general formula of $(K,Na)NbO_3$, and the piezoelectric film 14 in this preferred embodiment may comprise the potassium sodium niobate expressed by $(K_{0.5}Na_{0.5})NbO_3$, for instance.

The piezoelectric film 14 may be formed to have one of plane orientations (100), (110), (010) and (111). At this time, when the intermediate film 13 is oriented in the plane orientation (100), the piezoelectric film 14 formed to be adjacent to the intermediate film 13 may be oriented in the plane orientation (100) with a high rate. In this case, the piezoelectric film 14 is oriented in the plane orientation (100) with a high rate, so that it is possible to form the piezoelectric element 1 having a high piezoelectric constant.

Further, for instance, the piezoelectric film 14 is formed such that an average grain size of the piezoelectric material composing the piezoelectric film 14 is within the range of 0.1 μm to 1.0 μm. Miniaturization and high performance of the piezoelectric element 1 is required in accordance with the miniaturization and the high performance of the electronic components using the piezoelectric element. Namely, in case that the piezoelectric film 14 is formed to have the thickness of about 10 μm, for instance, if the grain size of the piezoelectric material composing the piezoelectric film 14 is close to the film thickness of the piezoelectric film 14, the piezoelectric characteristic inside the piezoelectric film 14 varies and the piezoelectric film 14 is also remarkably deteriorated.

Therefore, it is preferable that the average grain size of the piezoelectric material composing the piezoelectric film 14 is sufficiently smaller than the film thickness of the piezoelectric film 14.

Further, the piezoelectric film 14 may comprise $(K,Na)NbO_3$ having a composition, in which the value of $Na/(K+Na)$ is within the range of 0.4 to 0.75. $(K,Na)NbO_3$ as the piezoelectric material composing the piezoelectric film 14 may contain other elements than potassium (K), sodium (Na), niobium (Nb), and oxygen (O) which are elements composing the piezoelectric material. For instance, $(K,Na)NbO_3$ as the piezoelectric material composing the piezoelectric film 14 may contain lithium (Li) or tantalum (Ta) with 10 at. % or less in total.

The upper electrode 15 in this preferred embodiment comprises a metallic material, for instance, Pt with a film thickness of 0.02 μm. The piezoelectric element 1 is formed to have a strip-shape with a length of 20 mm and a width of 2.5 mm. It is possible to form the upper electrode 15 from a compound containing a metallic material other than Pt.

The intermediate film 13 may comprise a plurality of layers. For example, the intermediate film 13 may comprise a first partial intermediate film and a second partial intermediate film. For instance, the first partial intermediate film and the second partial intermediate film are formed in this order from a side of the lower electrode 12 to a side of the piezoelectric film 14. The second partial intermediate film is adjacent to the piezoelectric film 14, and may comprise a compound having the pseudo-cubic or cubic crystal with perovskite structure and the lattice constant of 0.391 nm or less.

Figure 2:
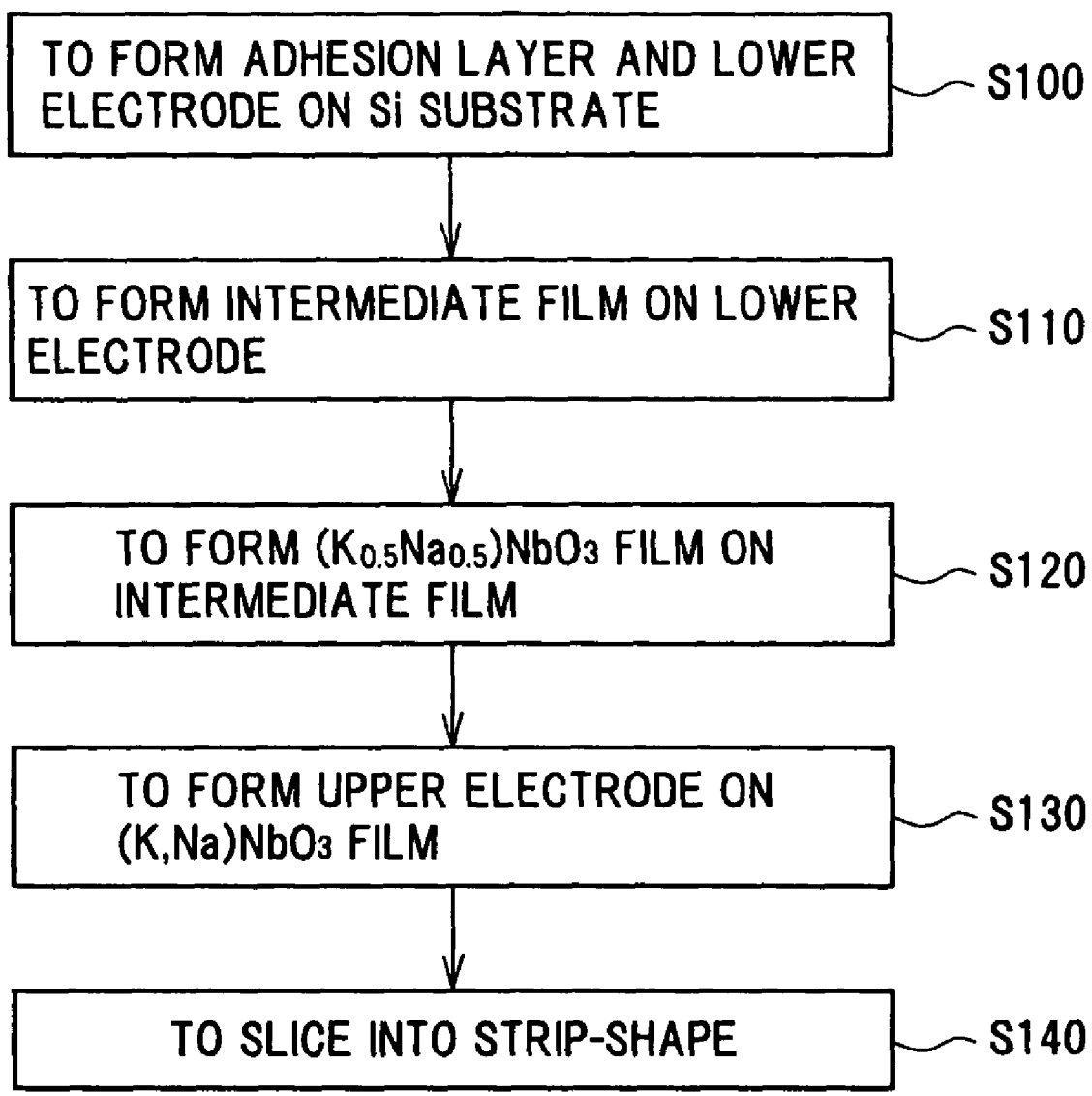
FIG. 2 is a flow chart showing a manufacturing process of the piezoelectric element in the preferred embodiment.

FIG. 2 is a flow chart showing a manufacturing process of the piezoelectric element in the preferred embodiment.
(Method for Manufacturing the Piezoelectric Element 1)

Firstly, the adhesion layer 11 comprising Ti with a film thickness of 2 nm and the lower electrode 12 comprising Pt with a film thickness of 0.2 μm (preferred orientation (111)) are sequentially formed on the Si substrate 10 provided with a thermally-oxidized film (plane orientation (110), a thickness of 0.5 mm, 20 mm×20 mm in square) by using an RF magnetron sputtering method (S100).

The film formation condition for the adhesion layer 11 and the lower electrode 12 is as follows. Namely, the adhesion layer 11 and the lower electrode 12 are sequentially grown in this order by setting a substrate temperature at 350° C. with a discharge power of 200 W in an Ar introduced gas atmosphere under a pressure of 2.5 Pa. The film formation time is set for 1 minute for the adhesion layer 11 and 10 minutes for the lower electrode 12.

Subsequently, the intermediate film 13 is formed on the lower electrode 12 under predetermined film formation condition. Concretely, a $LaNiO_3$ film having a thickness of 0.2 μm is formed on the lower electrode 12 by using the RF magnetron sputtering method (S110).

The film formation condition for the intermediate film 13 by using the RF magnetron sputtering method is as follows. The intermediate film 13 is formed by setting a substrate temperature of the Si substrate 10 having the lower electrode 12 at 650° C. with a discharge power of 120 W in the Ar introduced gas atmosphere under a pressure of 0.4 Pa. A sintered member of $LaNiO_3$ is used as a target for the RF magnetron sputtering. The film formation time is set for 10 minutes for the intermediate film 13.

Next, the piezoelectric film 14 is formed on the intermediate film 13 under a predetermined film formation condition. Concretely, a $(K_{0.5}Na_{0.5})NbO_3$ film having a thickness of 3

μm is formed on the intermediate film 13 by using the RF magnetron sputtering method (S120).

The predetermined film formation condition of the piezoelectric film 14 by using the RF magnetron sputtering method is as follows. Namely, the piezoelectric film 14 is formed by setting a substrate temperature of the Si substrate 10 having the intermediate film 13 at 650° C. with a discharge power of 100 W in the Ar introduced gas atmosphere under a pressure of 0.4 Pa.

Further, the film formation time of the piezoelectric film 14 is set for 4 hours. A sintered member of $(K,Na)NbO_3$ having a composition which satisfies relations of $(K+Na)/Nb=1.0$ and $K/(K+Na)=0.5$ is used as a target for the RF magnetron sputtering method.

Subsequently, the upper electrode 15 comprising the Pt with the thickness of 0.02 μm is formed on the piezoelectric film 14, i.e. the $(K,Na)NbO_3$ film formed at the step of (S120) (S130). For instance, the upper electrode 15 is formed by using the RF magnetron sputtering method. Then, the substrate 10 on which the adhesion layer 11, the lower electrode 12, the intermediate film 13, the piezoelectric film 14, and the upper electrode 15 are formed is sliced to provide the piezoelectric element 1 having the strip-shape with the length of 20 mm and the width of 2.5 mm (S140).

It is possible to form the potassium sodium niobate film by using a PLD method, a MOCVD method, a sol-gel method, an aerosol deposition method, Liquid Phase Epitaxy (LPE) method as well as the sputtering method. Further, the piezoelectric film 14 may be formed by mixing a small amount of additives into the potassium sodium niobate film. For instance, Li of 8% or less in atomic concentration may be used as the small amount of additives.

Figure 3:
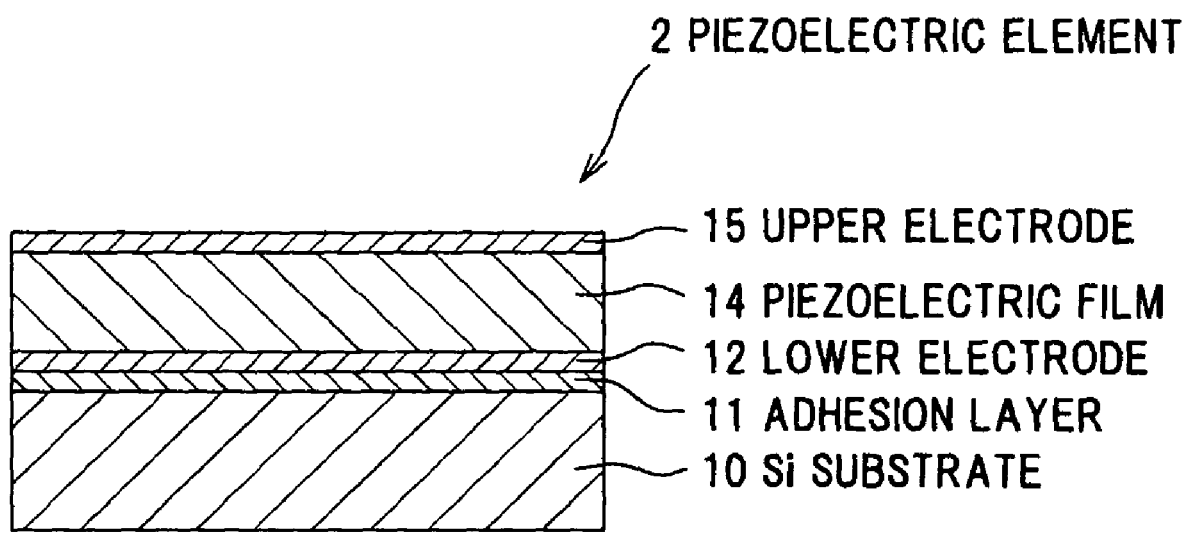
FIG. 3 is a cross sectional view of a piezoelectric element in a comparative example.

FIG. 3 is a cross sectional view of a piezoelectric element in a comparative example.

A piezoelectric element 2 in the comparative example has a substantially same configuration and is manufactured by a substantially same process as that of the piezoelectric element 1 in the preferred embodiment, except that the intermediate film 13 is not formed between the lower electrode 12 and the piezoelectric film 14. Therefore, detailed explanation thereof is omitted.

The piezoelectric element 2 in the comparative example comprises a silicon (Si) substrate 10 having a plane orientation (100), an adhesion layer 11 formed on the Si substrate 10, a lower electrode 12 formed on the adhesion layer 11, and a piezoelectric film 14 formed on the lower electrode 12, and an upper electrode 15 formed on the piezoelectric film 14. Further, the piezoelectric element 2 in the comparative example is also manufactured by a substantially same process as that of the piezoelectric element 1 in the preferred embodiment, except that the intermediate film 13 is not formed.

FIGS. 4A and 4B show the outline of the evaluation method of the piezoelectric constant $d_{31}$ of the piezoelectric elements in the preferred embodiment and the comparative example.

The piezoelectric constant $d_{31}$ is evaluated for both of the piezoelectric element 1 in the preferred embodiment and the piezoelectric element 2 in the comparative example.

The piezoelectric constant $d_{31}$ is evaluated as follows. Firstly, a simplified unimorph cantilever is composed by fixing an end in a longitudinal direction of the piezoelectric element with a clamp 20 as shown in FIG. 4A. Next, a predetermined voltage is applied to the $(K,Na)NbO_3$ film as the piezoelectric film 14 between the upper electrode 15 and the lower electrode 12 in this state. As a result, the $(K,Na)NbO_3$ film expands and contracts so that the whole unimorph lever performs a flexing (bending) action, and an end of the cantilever is operated as shown in FIG. 4B. At this time, a displacement amount 300 shows a displacement between a surface position 300a of a surface 18a of the upper electrode 15 before applying the voltage and a surface position 300b of the surface 18a of the upper electrode 15 after applying the voltage, and the displacement amount 300 is measured by a laser Doppler displacement meter 30.

The piezoelectric constant $d_{31}$ is calculated from the displacement amount 300, a length of the cantilever, Young's modulus of the Si substrate 10 and the piezoelectric film 14, and the applied voltage.

For both of the piezoelectric element 1 in the preferred embodiment according to the present invention and the piezoelectric element 2 in the comparative example, the measurement is conducted by setting the applied voltage to 2V and 20V. respectively. The piezoelectric constant $d_{31}$ in two conditions (2V, 20V) are calculated for each of the piezoelectric element 1 and the piezoelectric element 2.

A value of $((d_{31}[20V]-d_{31}[2V])/d_{31}[20V])$, wherein a piezoelectric constant $d_{31}$ when the applied voltage is 2V is $d_{31}[2V]$ and a piezoelectric constant $d_{31}$ when the applied voltage is 20V is $d_{31}[20V]$, was calculated for each of the piezoelectric element 1 and the piezoelectric element 2. Further, based on the values of $((d_{31}[20V]-d_{31}[2V])/d_{31}[20V])$ calculated for each of the piezoelectric element 1 and the piezoelectric element 2, the applied voltage dependencies of the piezoelectric constant $d_{31}$ in the piezoelectric element 1 and the piezoelectric element 2 are compared with each other.

Table 1 shows the values $((d_{31}[20V]-d_{31}[2V])/d_{31}[20V])$ of the piezoelectric element 1 in the preferred embodiment according to the invention and the piezoelectric element 2 in the comparative example.

TABLE 1

| Film formation condition | $d_{31}[20 V]$ (-pm/V) | $d_{31}[2 V]$ (-pm/V) | $((d_{31}[20 V] - d_{31}[2 V])/d_{31}[20 V])$ |
|---|---|---|---|
| The preferred embodiment | 78.00 | 76.45 | 0.02 |
| The comparative example | 74.00 | 51.80 | 0.30 |

Referring to TABLE 1, the value of $((d_{31}[20V]-d_{31}[2V])/d_{31}[20V])$ of the piezoelectric element 1 in the preferred embodiment according to the invention is 0.02.

On the other hand, the value of $((d_{31}[20V]-d_{31}[2V])/d_{31}[20V])$ of the piezoelectric element 2 in the comparative example is 0.30, which is 15 times greater than that of the piezoelectric element 1 in the preferred embodiment according to the invention. In other words, the applied voltage dependency is largely reduced in the piezoelectric element 1 in the preferred embodiment according to the present invention.

The above experimental result can be explained as follows.

Since the potassium sodium niobate film is a pseudo-cubic crystal, the lattice constant is within a range from 0.394 to 0.402 (However, the range of the lattice constant may be shifted in accordance with various factors such as a composition ratio of K and Na, a binding force of the Si substrate 10 on which the piezoelectric film 14 is formed). When the potassium sodium niobate film is formed on a compound with the perovskite structure having a lattice constant of 0.391 nm or less, the lattice constant of the potassium sodium niobate film is greater than the lattice constant of the compound having the perovskite structure provided as a base layer. Therefore, the potassium sodium niobate film receives a stress compressed along an in-plane direction. In other words, a compressive stress is generated in the potassium sodium niobate film. The applied voltage dependency of the piezoelectric constant $d_{31}$ of the piezoelectric element 1 in which the piezoelectric film 14 is formed on the intermediate film 13 is reduced by an influence of the compressive stress.

The Inventors found that it is possible to control the stress applied to the piezoelectric film 14 by forming the intermediate film 13, thereby controlling the applied voltage dependency of the piezoelectric constant $d_{31}$ of the piezoelectric film 14 in accordance with following contemplation.

In other words, a thermal expansion coefficient (linear expansion coefficient) of the potassium sodium niobate film is smaller than thermal expansion coefficients of MgO and $SrTiO_3$, and is greater than a thermal expansion coefficient of Si. Therefore, when the potassium sodium niobate film is formed on a substrate of MgO or $SrTiO_3$, a compressive stress is applied to the potassium sodium niobate film. On the other hand, when the potassium sodium niobate film is formed on the Si substrate, a tensile stress is applied to the potassium sodium niobate film. In the case that the compressive stress is applied to the potassium sodium niobate film, the applied voltage dependency of the piezoelectric constant $d_{31}$ is decreased. In the case that the tensile stress is applied to the potassium sodium niobate film, the applied voltage dependency of the piezoelectric constant $d_{31}$ is increased.

In accordance with the above, the Inventors found that it is possible to control the stress applied to the piezoelectric film 14 by forming the intermediate film 13, which is adjacent to the piezoelectric film 14 and has a predetermined crystal structure, thereby controlling the applied voltage dependency of the piezoelectric constant $d_{31}$ of the piezoelectric film 14.

FIG. 5 is a graph showing a relationship of the value of $((d_{31}[20V]-d_{31}[2V])/d_{31}[20V])$ with respect to a lattice constant of a material with a perovskite structure composing an intermediate film.

TABLE 2 is a table showing the relationship of the value of $((d_{31}[20V]-d_{31}[2V])/d_{31}[20V])$ with respect to the lattice constant of the material with the perovskite structure composing the intermediate film.

TABLE 2

| Material | Lattice constant (nm) | $((d_{31}[20V] - d_{31}[2V])/d_{31}[20V])$ |
|---|---|---|
| KNN | 0.3960 | 0.295 |
| $NaNbO_3$ | 0.3949 | 0.300 |
| SRO | 0.3930 | 0.290 |
| $NaTaO_3$ | 0.3929 | 0.290 |
| STO | 0.3905 | 0.080 |
| LNO | 0.3840 | 0.020 |
| LAO | 0.3790 | 0.040 |
| $YAlO_3$ | 0.3703 | 0.060 |

Samples are prepared by forming a potassium sodium niobate film on each of compound layers with the perovskite structure (perovskite layers) having different lattice constants. Then, value of $((d_{31}[20V]-d_{31}[2V])/d_{31}[20V])$ showing the applied voltage dependency of the piezoelectric constant $d_{31}$ of each sample is examined.

Referring to FIG. 5 and TABLE 2, it is confirmed that the value of $((d_{31}[20V]-d_{31}[2V])/d_{31}[20V])$ is 0.1 or less, in the layer comprising the compound with the perovskite structure having the lattice constant of 0.391 nm or less.

In concrete, as to materials having the lattice constant greater than 0.391 nm, all of the respective applied voltage dependencies of the piezoelectric constant $d_{31}$ of KNN and $NaNbO_3$ expressed by a formula of $(K_xNa_{1-x})NbO_3$, SRO expressed by a formula of $SrRuO_3$, and $NaTaO_3$ are within a range from 0.29 to 0.30.

On the other hand, as to materials having a lattice constant of 0.391 nm or less, all of the respective applied voltage dependencies of the piezoelectric constant $d_{31}$ of STO expressed by a formula of $SrTiO_3$, LNO expressed by a formula of $LaNiO_3$, LAO expressed by a formula of $LaAlO_3$, and $YAlO_3$ are 0.1 or less.

According to the above experimental result, it is confirmed that it is possible to reduce the applied voltage dependency of the piezoelectric constant $d_{31}$ by using the material having the lattice constant 0.391 nm or less, namely, $LaNiO_3$, $SrTiO_3$, $LaAlO_3$, or $YAlO_3$ as the material composing the intermediate film 13.

Further, it is possible to form the intermediate film 13 from a mixed crystal of $LaNiO_3$, $SrTiO_3$, $LaAlO_3$, or $YAlO_3$, or a compound with perovskite structure comprising $LaNiO_3$, $SrTiO_3$, $LaAlO_3$, or $YAlO_3$ and additives of 10% or less of other elements, in the case that the lattice constant thereof is 0.391 nm or less.

Further, it is preferable that the intermediate film 13 is oriented in plane orientation (100), in order to align the orientation of the potassium sodium niobate film formed on the intermediate 13 with a high rate in a predetermined direction, thereby increasing the value of the piezoelectric constant.

Effect of the Preferred Embodiment

According to the piezoelectric element 1 in the preferred embodiment, it is possible to decrease the applied voltage dependency of the piezoelectric constant $d_{31}$, compared with the case that the intermediate film 13 is not formed between the lower electrode 12 and the piezoelectric film 14, since the intermediate film 13 formed between the lower electrode 12 and the piezoelectric film 14 generates the compressive stress in the piezoelectric film 14.

According to this structure, it is possible to provide the piezoelectric element comprising a Pb-free piezoelectric material with an excellent piezoelectric characteristic.

Further, in the piezoelectric element 1 in the preferred embodiment, there are great advantages in fabrication cost and in industrial application in view of availability, compared with the piezoelectric element using the MgO substrate or the like.

Although the invention has been described, the invention according to claims is not to be limited by the above-mentioned embodiments. Further, please note that not all combinations of the features described in the embodiment are not necessary to solve the problem of the invention.

What is claimed is:
1. A piezoelectric element comprising:
   a Si substrate;
   a piezoelectric film formed above the Si substrate and comprising a potassium sodium niobate expressed by a general formula (K,Na)$NbO_3$ with perovskite structure with a film thickness within a range of 0.3 μm to 10 μm; and
   an intermediate layer formed between the Si substrate and the piezoelectric film for generating a stress in a compressive direction in the piezoelectric film,
   wherein the piezoelectric film further comprises piezoelectric material having an average grain size within a range 0.1 μm to 1.0 μm,
   wherein the intermediate layer further comprises additives of 10% or less of other elements and has the perovskite structure, and
   wherein the additives in the intermediate layer are in a range of greater than 0% and 10% or less of the other element; and wherein the intermediate layer comprises at least one compound selected from the group consisting of $LaAlO_3$ and $YAlO_3$.

2. The piezoelectric element according to claim 1, wherein the piezoelectric film is formed above the Si substrate by RF magnetron.

3. The piezoelectric element according to claim 1, wherein the intermediate layer is predominantly oriented in one of plane orientations (100), (110), (010), and (111).

4. The piezoelectric element according to claim 1, wherein the piezoelectric film is predominantly oriented in one of plane orientations (100), (110), (010), and (111).

5. The piezoelectric element according to claim 1, further comprising a thermally-oxidized film on the Si substrate.

6. The piezoelectric element according to claim 1, further comprising a metallic layer comprising Pt or Pt and Ti between the intermediate layer and the Si substrate.

7. The piezoelectric element according to claim 6, wherein the Pt in the metallic layer is predominantly oriented in a plane orientation (111).

8. The piezoelectric element according to claim 1, wherein the piezoelectric film further comprises additives 10 at. % or less in total of at least one of Li and Ta.

9. The piezoelectric element according to claim 1, wherein a value of Na/(K+Na) in the $(K,Na)NbO_3$ of the piezoelectric film is in a range from 0.4 to 0.75.

10. The piezoelectric element according to claim 1, wherein the intermediate layer comprises:
a first partial intermediate film; and
a second partial intermediate film adjacent to the piezoelectric film, and
wherein the second partial intermediate film comprises a compound having a pseudo-cubic or cubic crystal with perovskite structure and a lattice constant of 0.391 nm or less.

11. The piezoelectric element according to claim 1, wherein the intermediate layer is oriented in plane orientation (100).

12. The piezoelectric element according to claim 1, wherein a thickness of said intermediate layer is 0.2 μm.

13. The piezoelectric element according to claim 1, wherein said intermediate film is formed by RF magnetron on a lower electrode grown above said Si substrate, and
wherein said piezoelectric film is formed on said intermediate film.

* * * * *